United States Patent [19]

van der Putten et al.

[11] Patent Number: 5,059,449
[45] Date of Patent: Oct. 22, 1991

[54] METHOD OF SELECTIVELY PROVIDING A METAL FROM THE LIQUID PHASE ON A SUBSTRATE BY MEANS OF A LASER

[75] Inventors: Andreas M. T. P. van der Putten; Johannes M. G. Rikken; Johannes W. M. Jacobs; Cornells G. C. M. De Kort, all of Eindhoven, Netherlands

[73] Assignee: U.S. Philips Corporation, New York, N.Y.

[21] Appl. No.: 395,536

[22] Filed: Aug. 15, 1989

[30] Foreign Application Priority Data

Aug. 18, 1988 [NL] Netherlands ............. 8802047

[51] Int. Cl.$^5$ ............. B05D 3/06; B05D 5/12
[52] U.S. Cl. ................. 427/53.1; 427/98; 427/123; 427/125
[58] Field of Search ........... 427/53.1, 96, 98, 123, 427/125

[56] References Cited

U.S. PATENT DOCUMENTS

| 4,126,468 | 11/1978 | Kitteridge | 427/98 |
| 4,239,789 | 12/1980 | Blum et al. | 427/53.1 |
| 4,349,583 | 9/1982 | Kulynych et al. | 427/53.1 |
| 4,444,801 | 4/1984 | Hongs et al. | 427/53.1 |
| 4,510,222 | 4/1985 | Okunaka et al. | 427/53.1 |
| 4,511,597 | 4/1985 | Teng et al. | 427/53.1 |
| 4,526,807 | 7/1985 | Auerbach | 427/53.1 |
| 4,659,587 | 4/1987 | Imura et al. | 427/53.1 |

OTHER PUBLICATIONS

Hackh's Chemical Dictionary, McGraw-Hill Book, Co., Inc., p. 43, 1944.

Primary Examiner—Shrive Beck
Assistant Examiner—Marianne Padgett
Attorney, Agent, or Firm—Norman N. Spain

[57] ABSTRACT

From a solution comprising a salt of a noble metal, for example Pd, and ammonia or amine a metal track is deposited on a substrate surface which may be an insulator, semiconductor or conductor, by means of a laser beam.

4 Claims, 1 Drawing Sheet

METHOD OF SELECTIVELY PROVIDING A METAL FROM THE LIQUID PHASE ON A SUBSTRATE BY MEANS OF A LASER

BACKGROUND OF THE INVENTION

The instant invention relates to a method of selectively providing a metal on a surface of a substrate, in which the surface is brought into contact with a solution of a salt of that metal and said surface is locally irradiated by means of a laser beam.

Such a method is described in PCT Patent Application WO 82/03801. In the application a description is given of the provision of a metal track of, for example, platinum on a semiconductor surface of a III–V compound such as, for example, InP. For this purpose, such a surface is brought into contact with an aqueous or alcoholic solution of a platinum salt, for example $H_2PtCl_6$. A laser beam is focussed onto the InP surface, and the semiconductor surface is displaced relative to the laser beam. At the location where the laser impinges on the semiconductor surface a chemical reaction takes place between the semiconductor surface and the solution, such that platinum is deposited on the semiconductor surface in the form of a metal. According to the present recognitions, this mechanism is based on the generation of electron-hole pairs at the semiconductor surface by irradiation by means of the laser, provided that the energy of the photons is at least equal to the gap of the semiconductor. The electrons generated reduce the metal ions to metal. In this manner a metal track having a width of 2 mm is provided selectively and without mask on a semiconductor surface. Such a method can be used for the manufacture of, for example, contact areas on Integrated Circuits (ICs).

A disadvantage of the known method is that it can only be used to plate semiconductor surfaces. The said method cannot be used to plate metal surfaces or surfaces of insulators.

SUMMARY OF THE INVENTION

It is an object of the invention, inter alia, to provide a method of the type described in the opening paragraph by means of which semiconductor surfaces and metal and insulator surfaces can be plated.

According to the invention, this object is achieved by a method as described in the opening paragraph, which is characterized in that the solution also comprises ammonia, amine or substituted or unsubstituted cyclohexanol, and in which the power of the laser beam is at least $10^5$ W per $cm^2$.

DETAILED DESCRIPTION OF THE INVENTION

Figure 1:
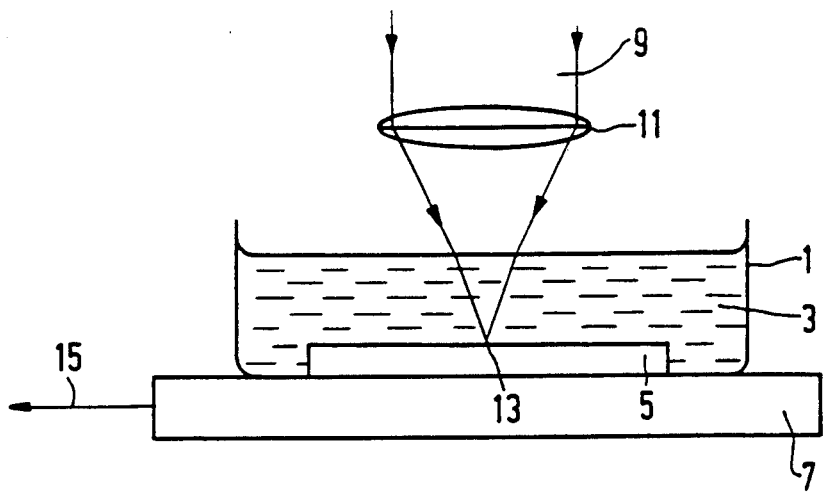
FIG. 1 is a diagrammatic representation of an arrangement for carrying out the method consisting in plating a substrate according to a pattern by means of a laser.

It has been found that from a solution of, for example, $PdCl_2$ in water to which ammonia, amine or cyclohexanol is added, palladium can be deposited on a substrate surface by means of a laser. In this case, the surface may be an insulator, a semiconductor or a metal surface. The mechanism is based on thermochemical decomposition of ammonia, amine or substituted or unsubstituted cyclohexanol under the influence of the high energy density of the laser beam. Under such conditions these compounds are dehydrogenized, thereby forming atomic hydrogen in accordance with the equations:

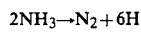
$$2NH_3 \rightarrow N_2 + 6H$$

$$cyclohexanol \rightarrow phenol + 6H$$

The atomic hydrogen formed reduces the palladium ions to the corresponding palladium metal. The compounds which are added to the metallic salt solution are not within the group of the well-known reducing agents such as hypophosphite, formaldehyde, hydrazine and dimethyl aminoborane which are used in electroless plating baths. The latter reducing agents are reductive at temperatures below 100° C.

When the method according to the invention is used, substances such as ammonia, amine and cyclohexanol are reductive, causing metal ions to be reduced to the corresponding metal.

To increase the solubility in aqueous solutions cyclohexanol may be substituted with, for example, one or more sulphonate groups.

The reaction only takes place where the substrate surface is irradiated by the laser. The wavelength of the laser light is to be selected such that absorption of the laser light by the substrate surface takes place, so that the substrate surface is heated locally. The solution of Pd salt in ammonia is transparent for a large wavelength range, so that no undesirable absorption of laser light takes place in the solution.

Water or other solvents in which metallic salts dissolve such as alcohols, for example glycol, can be used as a solvent. Mixtures of such solvents can also be used.

In principle, all soluble metallic salts can be used. To deposit metal alloys a solution is used in which two or more different metallic salts are dissolved.

According to this method, metallic contact areas and patterns can be formed on each substrate surface without using a mask. Metal tracks can be formed on the substrate surface in any pattern by displacing the substrate surface and the laser beam relative to each other. The substrate may be displaced relative to the laser beam, for example, by means of an XY table.

Another possibility consists in displacing the laser beam over the substrate surface by means of a tilting-mirror mechanism. Nucleation with, for example, $SnCl_2/PdCl_2$ as is required in the case of electroless plating of non-metallic substrate surfaces can be omitted in the method according to the invention. However, nucleating the substrate with $SnCl_2/PdCl_2$ promotes the initiation of the metal deposition and the bonding of the metal.

The solution used in the method according to the invention does not comprise a reducing agent such as hypophosphite, formaldehyde, hydrazine or dimethyl aminoborane.

It is to be noted that in U.S. Pat. No. 4,239,789 a description is given of a method by means of which each substrate can be provided with a metal layer from the liquid phase by means of a laser. The plating solution described therein is an electroless plating bath in which a reducing agent such as sodium hypophosphite ($NaH_2PO_2$) is dissolved. The so-called "background plating" takes place in the unexposed areas of the substrate, and in the exposed areas the deposition rate is increased by a factor of $10^3$ to $10^4$. As is the case with many electroless plating processes the substrate surface also has to be activated previously, for example, by $PdCl_2$. In the method according to the invention, no reducing agent is used in the plating solution, so that no "background plating" occurs. The above deposition rate is maximally 0.08 μm/s, whereas the deposition rate obtained by the method according to the invention is approximately 6 μm/s. In the method according to the invention activation by means of, for example, $PdCl_2$ is not necessary.

In U.S. Pat. No. 4,349,583 a description is given of a method by means of which a metal layer can be deposited from the liquid phase on a metal substrate by means of a laser. The plating solution used does not contain a reducing agent and is a so-called metal exchange solution. This method can only be used with substrates having such a metal surface that at the location where the laser beam impinges on the metal surface the less noble metal of the surface is exchanged at an accelerated rate with the more noble metal from the plating solution. In the method according to the invention, nonmetallic substrate surfaces also can be plated.

An embodiment of the method according to the invention is characterized in that an insulator is used as the surface of the substrate. The method according to the invention can be advantageously used to apply or repair metal patterns on surfaces of semiconductor devices. Such surfaces often comprise insulators such as $SiO_2$ or $Si_3N_4$.

An embodiment of the method according to the invention is characterized in that the metal is selected from the group formed by Pd, Pt, Rh, Ir, Ru and Ag. Using the method according to the invention these metals are not subjected to oxidation into the corresponding oxides. Less noble metals such as Cu often lead to the formation of oxides, so that no conducting tracks are formed on the substrate surface. The addition of a noble-metal salt to the copper-salt solution, thereby forming a copper alloy on the substrate surface, does lead to a conducting track. Aqueous solutions of the salts of these metals, for example acetates, chlorides or sulphates, are colourless after the addition of ammonia or amine, so that no absorption of visible laser radiation takes place in the solution. An example of an amine that can be used is 1, 2-diaminoethane.

The metal-ion concentration in the solution is not critical and ranges, for example, between 0.002 and 0.2 mol/l.

The concentration of the ammonia or amine is not critical either, provided that it is present in excess relative to the stoichiometric quantity.

A preferred embodiment of the method according to the invention is characterized in that at the location of the substrate surface the laser beam is formed into an elongated spot. The diameter of the circle circumscribed is approximately 100 μm, the majority of the intensity being concentrated in an elongated area having a long and a short axis of 100 and 20 μm, respectively. The elongated area may be in the form of, for example, an ellipse or a rectangle. An ellipsoidal spot is generated by locating a cylindrical lens in the light path between the laser and the substrate. A rectangular spot can be generated by locating a rectangular diaphragm in the light path. In the manufacture of metal tracks, in which process the substrate is displaced relative to the laser spot, the long axis of the ellipse or rectangle coincides with the longitudinal axis of the metal track. An improved mass transport of the metal ions takes place in the longitudinal direction of the metal track by virtue of the local boiling phenomena occurring at the location of the laser spot, so that a smaller line width is obtained than in the case of a circular laser spot.

The invention will be explained in more detail by means of the following exemplary embodiments and with reference to the accompanying drawing.

Example 1

Ammonia is added to deionized water to a concentration of 2 mol/l. At the boiling temperature $PdCl_2$ is dissolved in this solution to a concentration of 0.02 mol/l. After cooling to room temperature this solution 3 is introduced into a beaker 1 as shown in FIG. 1. A semiconductor device 5 is present in the solution. The beaker is located on an XY-table 7. An $Ar^+$ laser (power 5 W) manufactured by Spectra Physics, type 165 (not shown) is arranged over the solution. The wavelength of the laser light is 488-514 nm. The laser light is incident on the semiconductor device via a cylindrical lens 11, and forms a spot 13 on the semiconductor device 5. By means of the XY table the semiconductor device is displaced relative to the spot in the direction of arrow 21.

Figure 2:
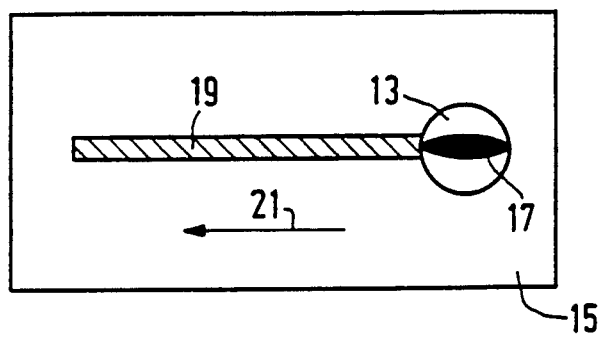
FIG. 2 is a diagrammatic top view of a substrate during the application of a metal track on said substrate.

FIG. 2 diagrammatically shows a top view of the semiconductor device and the laser spot 13 used. At the location of the semiconductor surface 15 the spot has a diameter of 100 μm. The intensity of the laser light in the spot is approximately $1.5.10^5$ W/cm$^2$ and, due to the use of the cylindrical lens 11 (FIG. 1), it is largely concentrated in the form of an ellipse 17 having a length of 100 μm and a width of 20 μm. The substrate moves relative to the laser spot in the direction of arrow 21 at a velocity of 500 μm/s. In this process, a Pd track 19 is formed having a width of 20 μm and a thickness of 10 μm. This corresponds to a Pd deposition rate of $10^5$ μm$^3$/s.

Figure 3A:
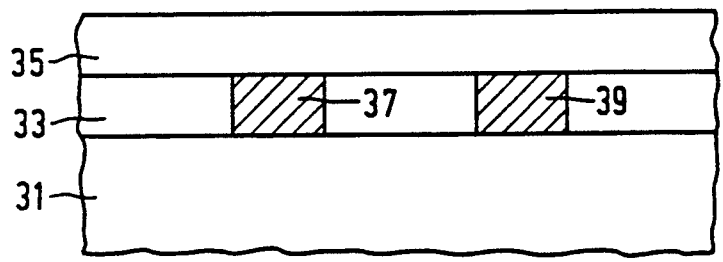
FIGS. 3a–c is a diagrammatic representation of a number of steps of a method according to the invention.
Figure 3B:
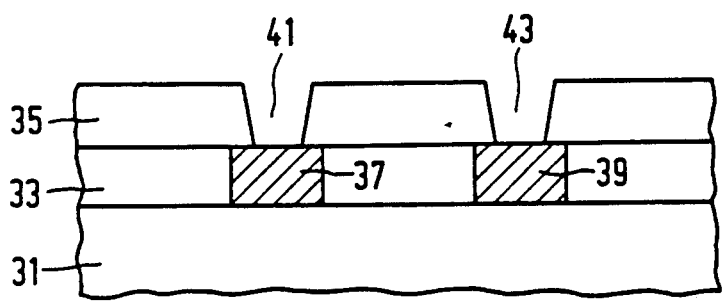
Figure 3C:
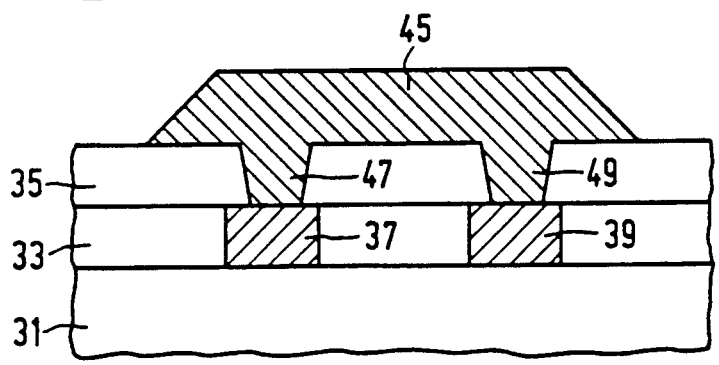

FIG. 3a is a cross-sectional view of a part of a semiconductor device, comprising a Si slice 31 carrying a layer of $SiO_2$ 33 having a thickness of 0.6 μm and a layer of $Si_3N_4$ 35 which also has a thickness of 0.6 μm. Al tracks 37 and 39 are present in the $SiO_2$ layer. Two contact holes 41 and 43 (FIG. 3b) having a diameter of 1-2 μm are burnt in the $Si_3N_4$ layer in ambient air by means of a pulsated Florod Xe laser (pulse time 1 μsec; power 700 W). By means of the method according to the invention, the holes are filled with Pd metal 47 and 49 (FIG. 3c) and the Pd metal track 45 is formed. This method can be used advantageously for repairing metal tracks of Integrated Circuits (ICs) or for making changes in existing ICs in the test and development phase.

Example 2

Example 1 is repeated using an aqueous solution of 0.02 mol/l of $H_2PtCl_6.6H_2O$ and a final concentration of 1 mol/l of 1, 2-diaminoethane. In this case, Pt metal 47 and 49 is formed in the holes 41 and 43 and a Pt metal track 45 is obtained.

Example 3

Example 1 is repeated using 100 nl of an aqueous solution of 0.02 mol/l of $AgNO_3$. A few drops of cyclohexanol are added to this solution, after which the solution is shaken. In this case, Ag metal 47 and 49 is formed in the holes 41 and 43 and a Ag metal track 45 is obtained.

We claim:

1. A method of selectively providing a metal on a surface of a substrate, said surface being semiconducting or electrically insulating, comprising immersing said surface in a solution of a salt of said metal, said solution consisting essentially of a solvent, said salt and essentially only a member selected from the group consisting of ammonia, a cyclohexanol and an amine and, while said surface is immersed in said solution, locally irradiating said surface through said solution with a laser beam, the power of which beam at said surface is at least $10^5$ W per cm$^2$ thereby causing said metal to be deposited on said substrate.

2. The method of claim 1 wherein the surface of the substrate is an electrically insulating surface.

3. A method as claimed in claim 1, characterized in that the metal is selected from the group consisting of Pd, Pt, Rh, Ir, Ru and Ag.

4. A method as claimed in claim 1, characterized in that the laser beam is formed into an elongated spot at the location of the substrate surface.

* * * * *